US008354775B2

(12) United States Patent
Nishie et al.

(10) Patent No.: US 8,354,775 B2
(45) Date of Patent: Jan. 15, 2013

(54) ULTRASONIC TRANSDUCER

(75) Inventors: Junichi Nishie, Kyoto (JP); Takaaki Asada, Moriyama (JP); Mio Furuya, Chiangmai (TH); Takayuki Shimamoto, Moriyama (JP); Kazuhiro Ebara, Yasu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 357 days.

(21) Appl. No.: 12/889,457

(22) Filed: Sep. 24, 2010

(65) Prior Publication Data

US 2011/0074246 A1 Mar. 31, 2011

(30) Foreign Application Priority Data

Sep. 30, 2009 (JP) ................................ 2009-228462

(51) Int. Cl.
*H01L 41/08* (2006.01)

(52) U.S. Cl. ........ 310/335; 310/322; 310/326; 310/327; 310/334

(58) Field of Classification Search .................. 310/322, 310/326, 327, 334, 335
See application file for complete search history.

(56) References Cited

U.S. PATENT DOCUMENTS

| | | | | |
|---|---|---|---|---|
| 4,705,981 | A * | 11/1987 | Inoue et al. | 310/324 |
| 5,195,373 | A * | 3/1993 | Light et al. | 73/632 |
| 7,954,387 | B1 * | 6/2011 | Furlong | 73/861.28 |
| 2009/0195123 | A1 * | 8/2009 | Murata et al. | 310/326 |
| 2011/0074246 | A1 * | 3/2011 | Nishie et al. | 310/327 |
| 2011/0082336 | A1 * | 4/2011 | Ito | 600/129 |

FOREIGN PATENT DOCUMENTS

| | | | |
|---|---|---|---|
| EP | 2 076 062 | A1 | 7/2009 |
| JP | 4-132400 | A | 5/1992 |
| JP | 6-253396 | A | 9/1994 |
| JP | 2007-318742 | A | 12/2007 |
| WO | 2008/047743 | A1 | 4/2008 |

* cited by examiner

*Primary Examiner* — Thomas Dougherty
(74) *Attorney, Agent, or Firm* — Keating & Bennett, LLP

(57) ABSTRACT

An ultrasonic transducer includes a case, a reflective portion, and a piezoelectric body. The case has a substantially cylindrical shape including one closed end in the center axis direction that defines a top. The piezoelectric body is disposed on the inner surface of the top of the case. The reflective portion is arranged to oppose and be spaced apart from the piezoelectric body. The distance between the piezoelectric body and the reflective portion is greater than the maximum displacement of the piezoelectric body and is substantially an odd number multiple of a ¼ wavelength of sound waves or less than or equal to the ¼ wavelength.

3 Claims, 5 Drawing Sheets

ULTRASONIC TRANSDUCER

BACKGROUND OF THE INVENTION

1. Field of the Invention

The present invention relates to an ultrasonic transducer that transmits or receives ultrasonic waves by driving a piezoelectric body.

2. Description of the Related Art

Some of the known ultrasonic transducers have configurations in which a piezoelectric body is disposed in a case.

FIG. 1A is a sectional view of a known ultrasonic transducer.

The ultrasonic transducer 100 includes a case 101, a piezoelectric body 102, a sound-absorbing member 103, a filler 104, and lead wires 105. The piezoelectric body 102 is bonded to the inner surface of the top of the case 101 with an adhesive (not shown). The case 101 has a cylindrical shape with a closed end. The filler 104 fills the space within the cylinder of the case 101 and is fixed therein to close the case 101. The sound-absorbing member 103 is disposed in the space within the case 101. One of the lead wires 105 is connected to the piezoelectric body 102, and extends out of the case through the filler 104.

This structure causes multiple reflections of sound waves in the inner space of the case 101. Sound waves attenuate with the multiple reflections. However, if sound waves reverberate for a long period of time, the waveform of the transmitted waves of the ultrasonic transducer may become dull due to the reverberation, or received waves may be obscured by the reverberation. Accordingly, the ultrasonic transducer 100 is provided with the sound-absorbing member 103 within the case 101 so as to absorb sound waves emitted from the piezoelectric body 102 toward the open side of the case 101 and, thus, to reduce the effects of reverberation.

Another type of the known ultrasonic transducers uses metal pins instead of the lead wires, as disclosed in, for example, Japanese Unexamined Patent Application Publication No. 2007-318742.

FIG. 1B is a sectional view of another known ultrasonic transducer.

The ultrasonic transducer 200 includes a case 201, a piezoelectric body 202, a fixing plate 203, a filler 204, and metal pins 205 arranged to transmit electrical signals to the outside. This type of ultrasonic transducer 200 uses metal pins 205, instead of lead wires, and includes a resin fixing plate 203 arranged to fix the metal pins 205.

With this structure, the fixing plate 203 is spaced a predetermined distance from the inner surface of the top of the cylindrical case 201 having a closed end, and to which a spring metal terminal 206 is secured to electrically connect one of the metal pins to the piezoelectric body 202. If the spring metal terminal 206 resonates with the piezoelectric body 202, the ultrasonic transducer 200 is likely to be adversely effected by reverberation. Accordingly, the resonant frequency of the spring metal terminal 206 is set to a frequency such that the spring terminal 206 does not resonate with the piezoelectric body 202. Thus, the effects of reverberation on the ultrasonic transducer 200 are reduced.

The effects of reverberation on the ultrasonic transducer can be reduced by providing a sound-absorbing member within the case, or by appropriately setting the resonant frequency of the spring metal terminal, as described above. However, theses countermeasures cannot completely eliminate reverberation of ultrasonic waves. Thus, there is a need to further reduce or eliminate the effects of reverberation.

SUMMARY OF THE INVENTION

To overcome the problems described above, preferred embodiments of the present invention provide an ultrasonic transducer that is less affected by reverberation.

According to a preferred embodiment of the present invention, an ultrasonic transducer including a case and a reflective portion is provided. The case preferably has a cylindrical shape with a closed end which defines a top. The piezoelectric body is disposed on the inner surface of the top of the case. The reflective portion opposes the piezoelectric body and is spaced apart from the inner surface of the top. The distance between the piezoelectric body and the reflective portion is greater than the maximum displacement of the piezoelectric body and is substantially an odd number multiple of a ¼ wavelength of sound waves or less than or equal to the ¼ wavelength.

The distance between the reflective portion and the piezoelectric body is set so as to accelerate the attenuation of multiple reflections of sound waves in the inner space of the case. The reflective portion disclosed herein describes a structure that satisfies the relationship: absorptivity for sound waves<reflectivity for sound waves. When the distance between the reflective portion and the piezoelectric body is substantially an odd number multiple of a ¼ wavelength of sound waves, the waves entering the wall of the reflective portion or the piezoelectric body and the waves reflecting from the wall cancel each other out to accelerate the attenuation of ultrasonic waves. In addition, when the distance between the reflective portion and the piezoelectric body is less than or equal to a ¼ wavelength of sound waves, the number of reflections of sound waves per unit time is greatly increased so as to accelerate the attenuation of ultrasonic waves.

Preferably, the ultrasonic transducer further includes a sound-absorbing member. Preferably, the sound-absorbing member is disposed between and spaced apart from the piezoelectric body and the reflective portion. With this structure, the sound-absorbing member further accelerates the attenuation of multiple reflections of ultrasonic waves. The sound-absorbing member disclosed herein describes a structure that satisfies the relationship: absorptivity for sound waves>reflectivity for sound waves.

Preferably, the reflective portion includes an opening arranged to communicate with the interior of the case and the exterior of the case and that is closed by the sound-absorbing member. With this structure, the sound-absorbing member can be provided without being in contact with the piezoelectric body. Consequently, vibration does not propagate through the sound-absorbing member from the piezoelectric body to the reflective portion. Thus, the effects of reverberation are greatly reduced.

According to preferred embodiments of the invention, by setting the distance between the reflective portion and the inner surface of the top of the case to substantially an odd number multiple of a ¼ wavelength, the waves entering the wall and the waves reflecting from the wall cancel each other out to accelerate the attenuation of ultrasonic waves. Also, by setting the distance between the reflective portion and the piezoelectric body so as to be less than or equal to a ¼ wavelength of sound waves, the number of reflections of sound waves per unit time is greatly increased to further accelerate the attenuation of ultrasonic waves. Consequently, the effects of reverberation on the ultrasonic transducer can be further reduced.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

An ultrasonic transducer 30 according to a first preferred embodiment of the present invention will now be described.

Figure 1A:
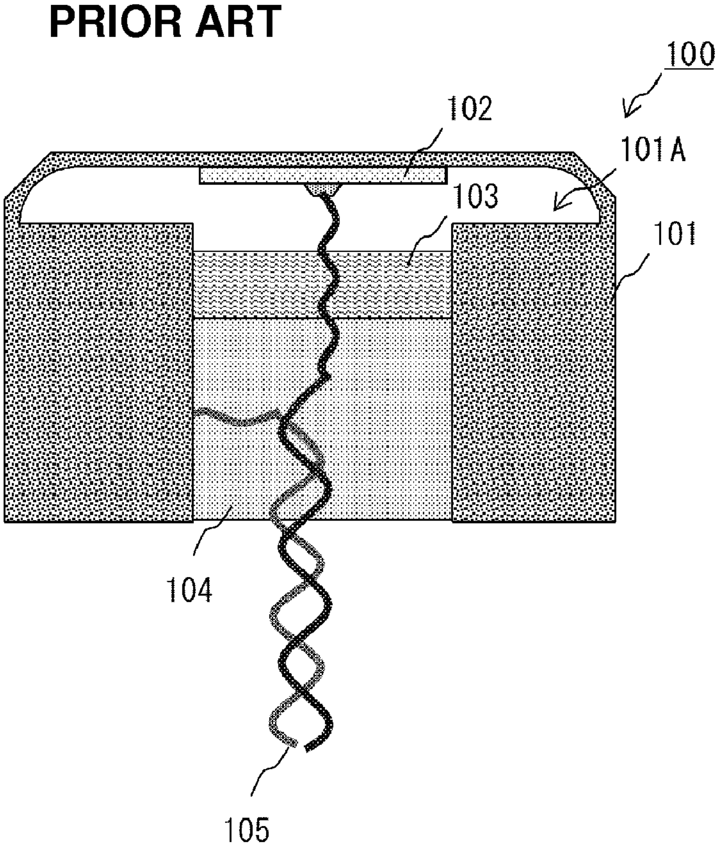
FIG. 1A PRIOR ART
FIGS. 1A and 1B are schematic representations of structures of known ultrasonic transducers.
Figure 1B:
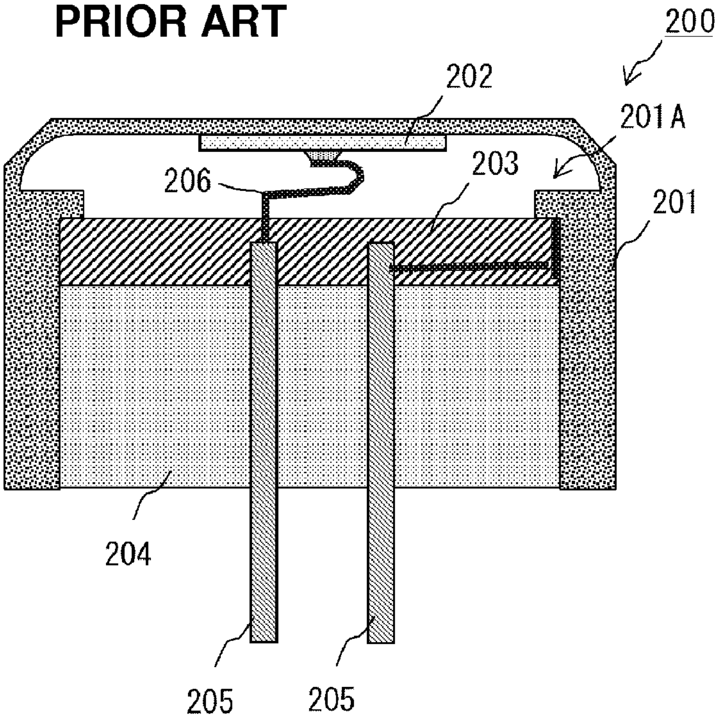
FIG. 1B PRIOR ART
Figure 2A:
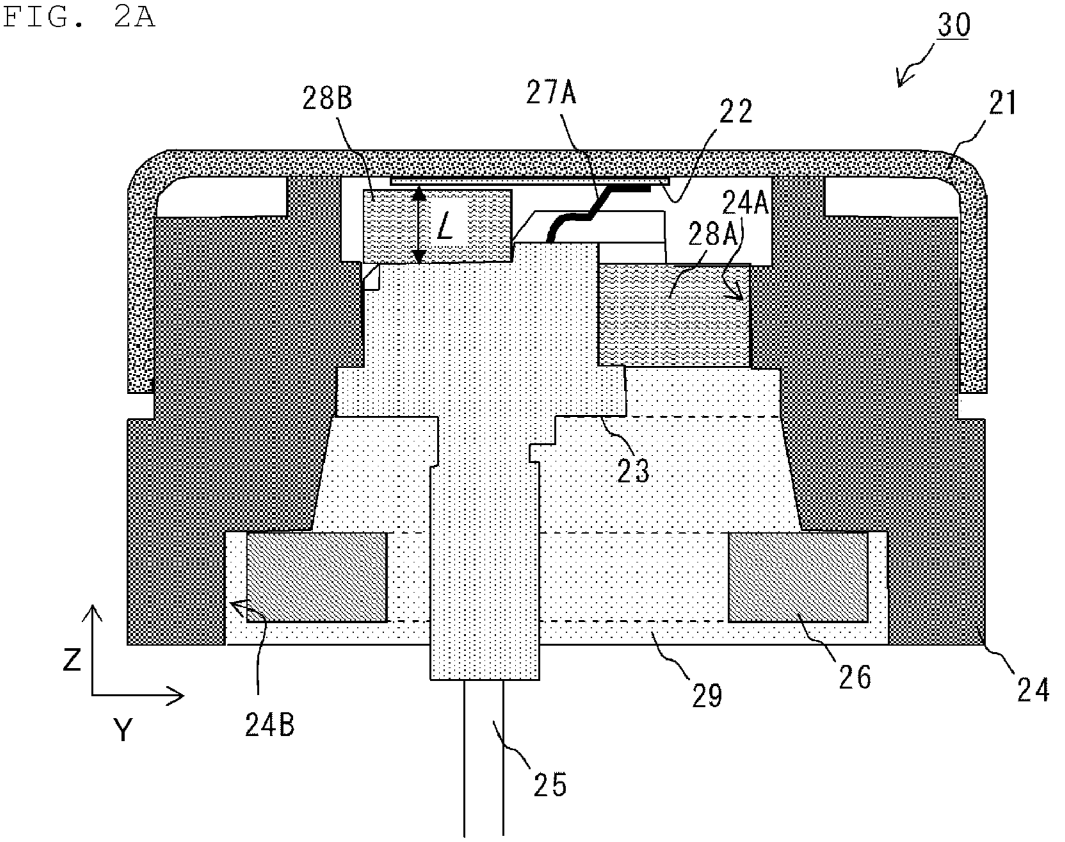
FIGS. 2A and 2B are schematic representations of an ultrasonic transducer according to a first preferred embodiment of the present invention
Figure 2B:
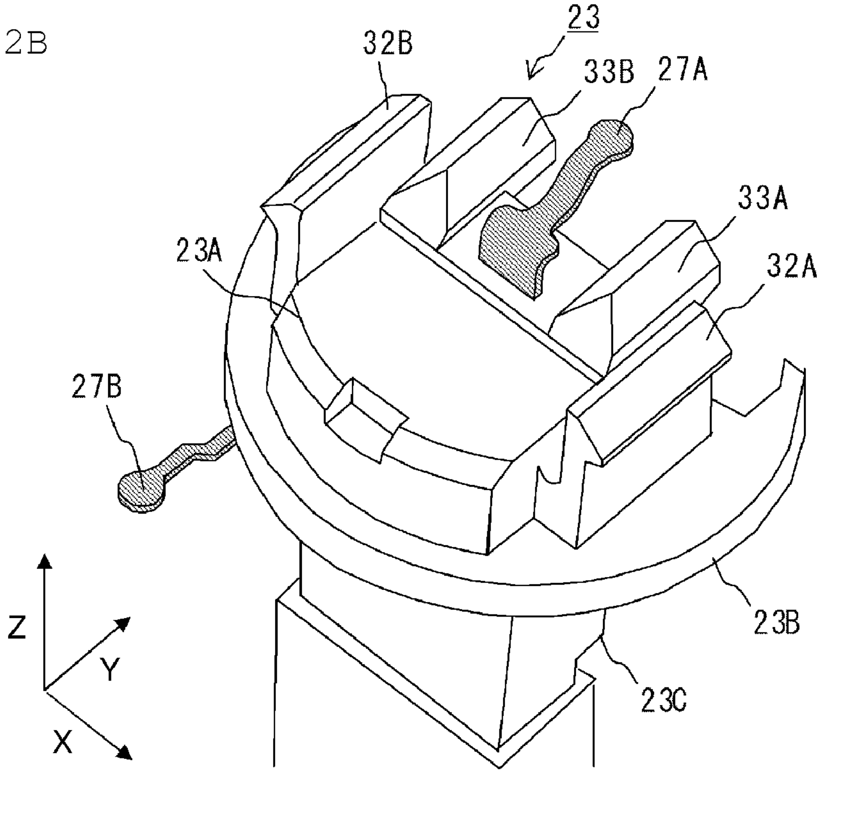

FIG. 2A is a sectional view of the ultrasonic transducer 30 in a Y-Z plane of a rectangular coordinate system. FIG. 2B is a perspective view of a fixed member 23 of the ultrasonic transducer 30.

The ultrasonic transducer 30 includes an upper cover 21, a piezoelectric body 22, a fixed member 23, a weight 24, an external connection terminal 25, a washer 26, spring metal terminals 27A and 27B, sound-absorbing members 28A and 28B, and a filler 29.

When the ultrasonic transducer 30 is used as a wave transmitter, a driving signal is applied to the external connection terminal 25 so that the piezoelectric body 22 extensionally vibrates in an X-Y plane. Consequently, a bending vibration occurs in the Z direction in the top surface of the upper cover 21 and, thus, ultrasonic waves are transmitted. When the ultrasonic transducer 30 is used as a wave receiver, the top surface of the upper cover 21 receives ultrasonic waves to vibrate, so that the piezoelectric body 22 extensionally vibrates to generate a wave-receiving signal in the external connection terminal 25.

The upper cover 21 preferably has a substantially cylindrical shape including one end in the positive z direction that is closed. The weight 24 is a cylinder whose center axes extends in the Z direction, and one end in the positive Z direction is engaged within the cylinder defined by the upper cover 21. The weight 24 includes a holding portion 24A arranged to hold the fixed member 23, and a recess 24B in which the washer is disposed. The holding portion 24A extends along an X-Y plane toward the center axis of the case. The upper cover 21 and the weight 24 are arranged to define a closed-end cylindrical case. In this preferred embodiment, the upper cover 21 corresponds to the top surface of the case. The washer 26 is a flat plate including an opening therein, and is disposed in the recess 24B of the weight 24.

Preferably, the upper cover 21 is made of a metal, such as aluminum, for example, and the weight 24 is made of a metal material having a higher specific gravity than the material of the upper cover 21, such as zinc, lead, iron, or stainless steel, for example. The upper cover 21 can be prepared by drawing or forging a plate coated with high-molecular-weight polyester. These methods improve the coating quality and reduce the cost. The upper cover 21 and the weight 24 may preferably be combined by welding, thermocompression bonding, caulking, adhesion, fitting or other suitable method, for example. If adhesion or fitting is used, the surface of the weight 24 may be subjected to plating, sandblasting, or primer coating, for example, so as to improve the corrosion resistance and the adhesion. The head of the weight 24 in the positive Z direction may preferably be round-chamfered or tapered (not shown), for example, to facilitate fitting thereof. The weight 24 preferably includes a copper underlayer which is plated with a nickel coating, for example, or a material that does not cause galvanic corrosion with the upper cover 21, such as chromium or titanium based materials, for example. The weight 24 may be provided with a chucking lug used during assembly or a flange arranged to prevent the weight from falling out after being mounted, at the negative Z direction side. In this instance, the flange may preferably have a substantially circular shape that is concentric with the opening of the weight 24, or a substantially polygonal shape, for example. The weight 24 may include a plurality of pieces. For example, the weight 24 may preferably include two pieces that are separable in the Z direction or along an X-Y plane. The weight 24 is preferably connected to a grounding electrode through the spring metal terminal 27B in the present preferred embodiment. Alternatively, the weight 24 may be connected to the grounding electrode by welding, thermocompression bonding, caulking, adhesion, or other suitable method, for example.

The filler 29 fills the space in the cylinder of the weight 24 to the negative Z direction side of the fixed member 23 and the sound-absorbing member 28A.

Preferably, the piezoelectric body 22 has a polarization axis extending in the Z direction and is bonded to the inner surface of the top of the upper cover 21 with an adhesive. The piezoelectric body 22 includes a driving electrode (not shown) connected to the external connection terminal 25 through the spring metal terminals 27A and 27B.

The fixed member 23 shown in detail in FIG. 2B includes an upper base 23A, a lower base 23B, a terminal holder 23C, fixing lugs 32A and 32B, and receiving portions 33A and 33B. The lower base 23B is preferably a substantially circular plate including a void. The upper base 23A preferably has a substantially rectangular shape having an area less than that of the lower base 23B in an X-Y plane, and is arranged to the positive Z direction side of the lower base 23B. The terminal holder 23C preferably has a substantially prismatic shape having a smaller area than the lower base 23B and the upper base 23A in an X-Y plane, and is disposed to the negative Z direction side of the lower base 23B. The upper base 23A, the lower base 23B and the terminal holder 23C are preferably coaxial with each other and the center axes extending through an X-Y plane coincide or substantially coincide with each other.

The fixing lugs 32A and 32B are disposed near the joint portion of the upper main surface (positive Z direction side) of the lower base 23B with the upper base 23A and extend in the positive Z direction beyond the level of the surface of the upper base 23A. Each of the fixing lugs 32A and 32B includes a return portion at the end in the positive Z direction. The receiving portions 33A and 33B have a substantially triangular prism shape extending in the Y direction, and are disposed on the main surface (positive Z direction side) of the upper base 23A.

The fixed member 23 is accommodated within the cylinder of the weight 24, and arranged with respect to the weight 24 with the main surface (positive Z direction side) of the lower base 23B abutting the lower main surface (negative Z direction side) of the holding portion 24A. The fixing lugs 32A and 32B are inserted into positions to the positive Z direction side of the holding portion 24A and their return portions come into contact with the main surface (positive Z direction side) of the holding portion 24A. Thus, the lower base 23B and the fixing lugs 32A and 32B pinch and hold the holding portion 24A. The terminal holder 23C extends in the negative Z direction through the opening of the washer 26.

One end of the external connection terminal 25 in the positive Z direction is held in the terminal holder 23C of the fixed member 23, and the other end extends from the fixed member 23. One sound-absorbing member 28A is supported with its upper main surface (positive Z direction side) in contact with the receiving portion 33A and its lower main surface (negative Z direction side) in contact with the lower base 23B of the fixed member 23. The other sound-absorbing member 28B is arranged to be spaced apart from the piezoelectric body 22 so that its upper main surface (positive Z direction side) does not come into contact with the piezoelectric body 22, and the lower main surface (negative Z direction side) of the sound-absorbing member 28B is bonded to the upper base 23A of the fixed member 23.

The sound-absorbing members 28A and 28B are arranged in the space within the case so as to attenuate sound waves. The sound-absorbing member satisfies the relationship: absorptivity for sound waves>reflectivity for sound waves. The sound absorbing material of the sound-absorbing member may preferably be felt, sponge, or other suitable material, for example. However, if the sound-absorbing members 28A and 28B come into contact with the spring metal terminal 27A or the piezoelectric body 22, the vibration propagates to the fixed member 23 through the sound-absorbing members 28A and 28B. This may significantly increase the effects of reverberation. Accordingly, a cutout or opening is provided in the portion of the fixed member 23 under the spring metal terminal 27A, and one of the sound-absorbing members 28A and 28B (the sound-absorbing member 28A in the present preferred embodiment) is disposed in the cutout or opening.

With this structure, the fixed member 23 functions as a reflective portion opposing the piezoelectric body 22. The reflective portion satisfies the relationship: absorptivity for sound waves<reflectivity for sound waves, and may preferably be made of, for example, a resin such as epoxy resin, ceramic, or a metal. The presence of the fixed member 23 that functions as a reflective portion enables the effects of reverberation on the ultrasonic transducer 30 to change with changes in the distance L between the fixed member 23 and the piezoelectric body 22. Accordingly, by setting the distance L so as to be an odd number multiple of a ¼ wavelength of ultrasonic waves, or to be less than or equal to the ¼ wavelength of ultrasonic waves, the effects of reverberation on the ultrasonic transducer 30 can be reduced.

Figure 3:
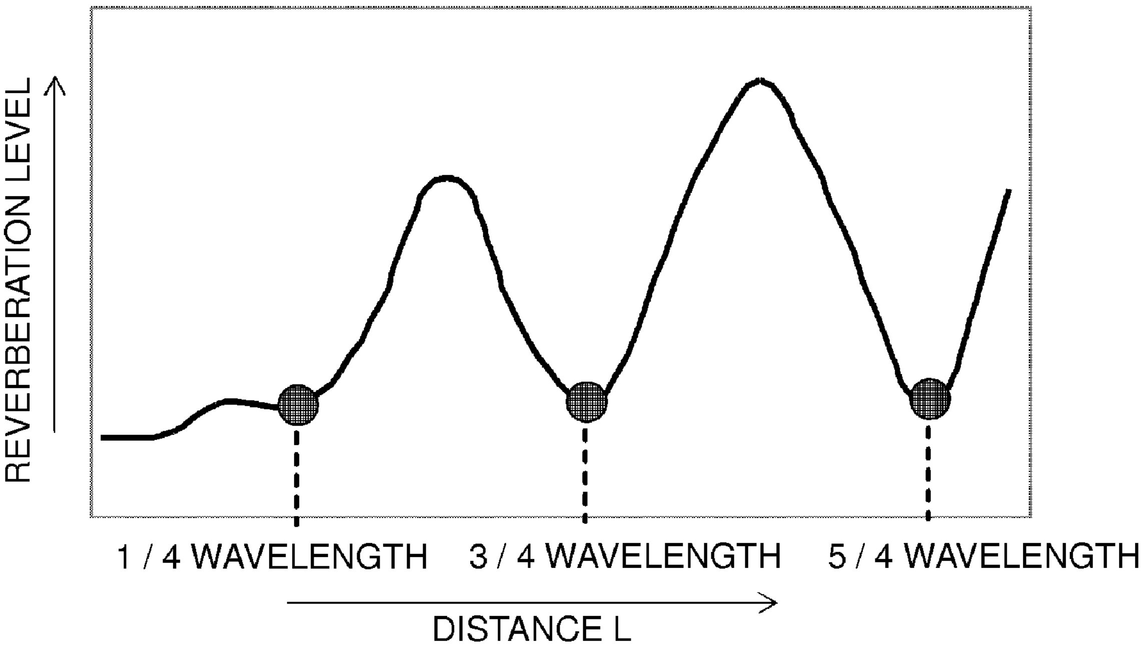
FIG. 3 is a plot showing the reverberation level of the ultrasonic transducer shown in FIGS. 2A and 2B.

FIG. 3 is a plot showing the relationship between the distance L and the reverberation level of the ultrasonic transducer 30.

In the present preferred embodiment, the case preferably is made of aluminum and has an outer diameter of about 14 mm, and an inner diameter of about 8 mm which is substantially vibrated by the piezoelectric body, for example. The reflective portion preferably is made of polybutylene terephthalate (PBT) and has an area of about 8 $mm^2$, for example. The piezoelectric body preferably has a diameter of about 6 mm, for example. The transducer preferably is driven at a frequency of about 48 kHz and at a peak-to-peak voltage of about 3.75 V, for example.

The reverberation level of the ultrasonic transducer 30 changes in a cycle in which the distance L between the fixed member 23 and the piezoelectric body 22 varies by a half wavelength of ultrasonic waves, and is minimized when the distance L is an odd number multiple of a ¼ wavelength of the ultrasonic waves. In addition, when the distance L is less than or equal to the ¼ wavelength of ultrasonic waves, the reverberation level becomes almost the same as the reverberation level when the distance L is an odd number multiple of a ¼ wavelength of ultrasonic waves.

Accordingly, by setting the distance L between the fixed member 23 and the piezoelectric body 22 so as to be an odd number multiple of a ¼ wavelength of ultrasonic waves, or to be less than or equal to the ¼ wavelength of ultrasonic waves, the effects of reverberation on the ultrasonic transducer 30 can be greatly reduced.

If the piezoelectric body 22 comes into contact with the fixed member 23, the effects of reverberation may be increased. Accordingly, it is preferable that the distance L between the fixed member 23 and the piezoelectric body 22 be equal to or greater than the maximum displacement of the piezoelectric body 22, for example, at least about 50 μm, so as to prevent contact between the piezoelectric body 22 and the fixed member 23.

An ultrasonic transducer 10 according to a second preferred embodiment of the present invention will now be described.

Figure 4:
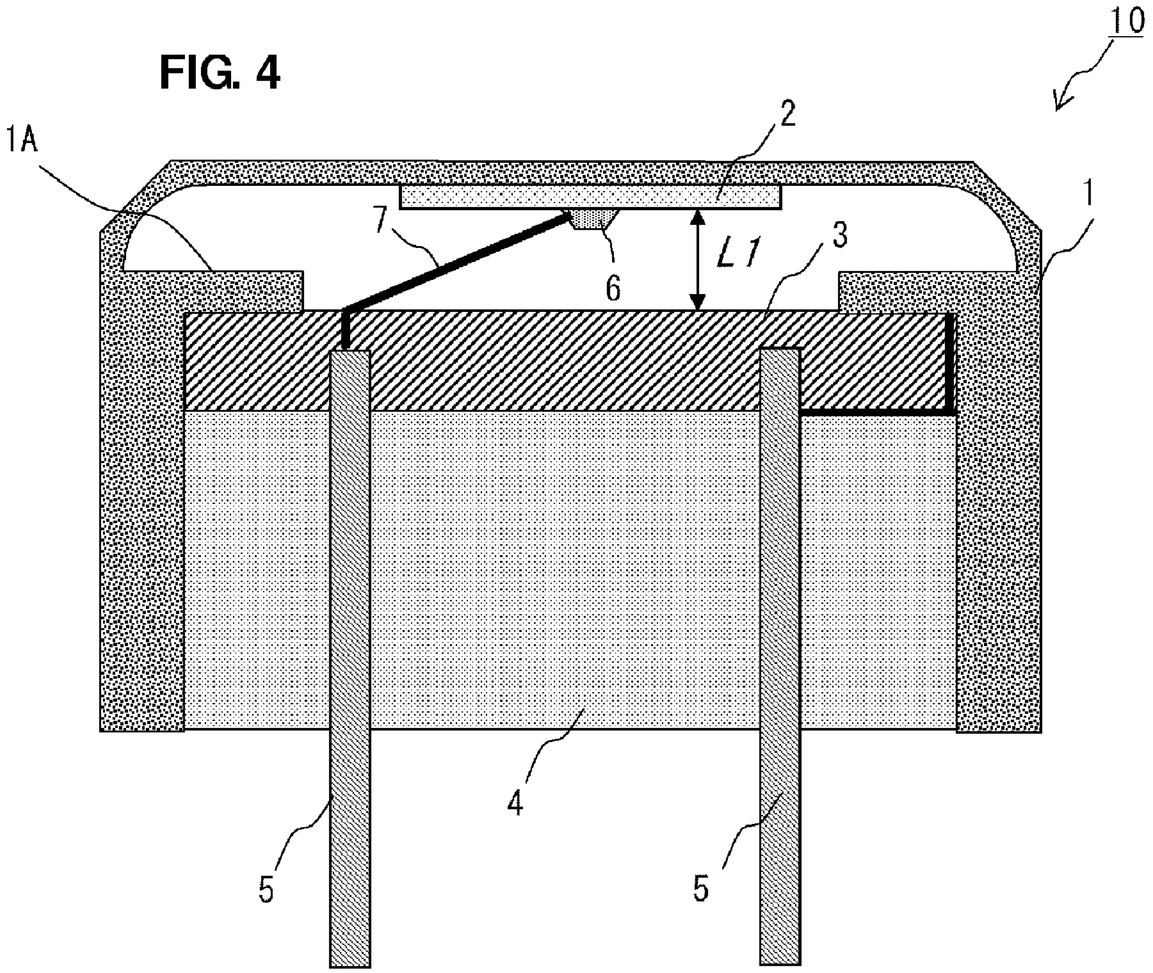
FIG. 4 is a schematic representation of an ultrasonic transducer according to a second preferred embodiment of the present invention.

FIG. 4 is a sectional view of an ultrasonic transducer 10.

The ultrasonic transducer 10 includes a case 1, a piezoelectric body 2, a fixed member 3, a filler 4, external connection terminals 5, an electroconductive adhesive 6, and an internal conductor line 7.

When the ultrasonic transducer 10 is used as a wave transmitter, a driving signal is applied to the external connection terminals 5 so that the piezoelectric body 2 extensionally vibrates in a horizontal plane. Consequently, a bending vibration occurs in the direction perpendicular or substantially perpendicular to the top surface of the case 1 and, thus, ultrasonic waves are transmitted. When the ultrasonic transducer 10 is used as a wave receiver, the top surface of the case 1 receives ultrasonic waves to vibrate in the vertical direction, so that the piezoelectric body 2 extensionally vibrates to generate a wave-receiving signal in the external connection terminals 5.

The case 1 preferably has a substantially cylindrical shape with a center axis extending in the vertical direction and upper end that is closed. The case 1 includes a holding portion 1A arranged to hold the fixed member 3 in the cylinder thereof. The holding portion 1A extends in the horizontal direction toward the center axis of the case 1. Preferably, the piezoelectric body 2 has a polarization axis extending in the vertical direction, and is bonded to the inner surface of the top of the case 1 with an adhesive (not shown). The fixed member 3 is accommodated within the cylinder of the case 1, and arranged to abut the lower main surface of the holding portion 1A. The filler 4 fills the space in the cylinder of the case 1 under the fixed member 3. The upper ends of the external connection terminals 5 are inserted and fixed in the fixed member 3, and the lower ends of the external connection terminals 5 extend from the cylinder of the case 1. The internal conductor line 7 electrically connects one of the external connection terminals 5 with the piezoelectric body 2. The electroconductive adhesive 6 connects the internal conductor line 7 to the piezoelectric body 2.

With this structure, the fixed member 3 functions as a reflective portion opposing the piezoelectric body 2. The presence of the fixed member 3 allows the effects of reverberation on the ultrasonic transducer 10 to change with changes in the distance L1 between the fixed member 3 and the piezoelectric body 2. Accordingly, by setting the distance L1 so as to be an odd number multiple of a ¼ wavelength of ultrasonic waves, or to be less than or equal to the ¼ wavelength of ultrasonic waves, the effects of reverberation on the ultrasonic transducer 10 can be greatly reduced. Also, by setting the distance L1 so as to be equal to or greater than the maximum displacement of the piezoelectric body 2, contact between the piezoelectric body 2 and the fixed member 3 can be prevented.

An ultrasonic transducer 20 according to a third preferred embodiment of the present invention will now be described.

Figure 5:
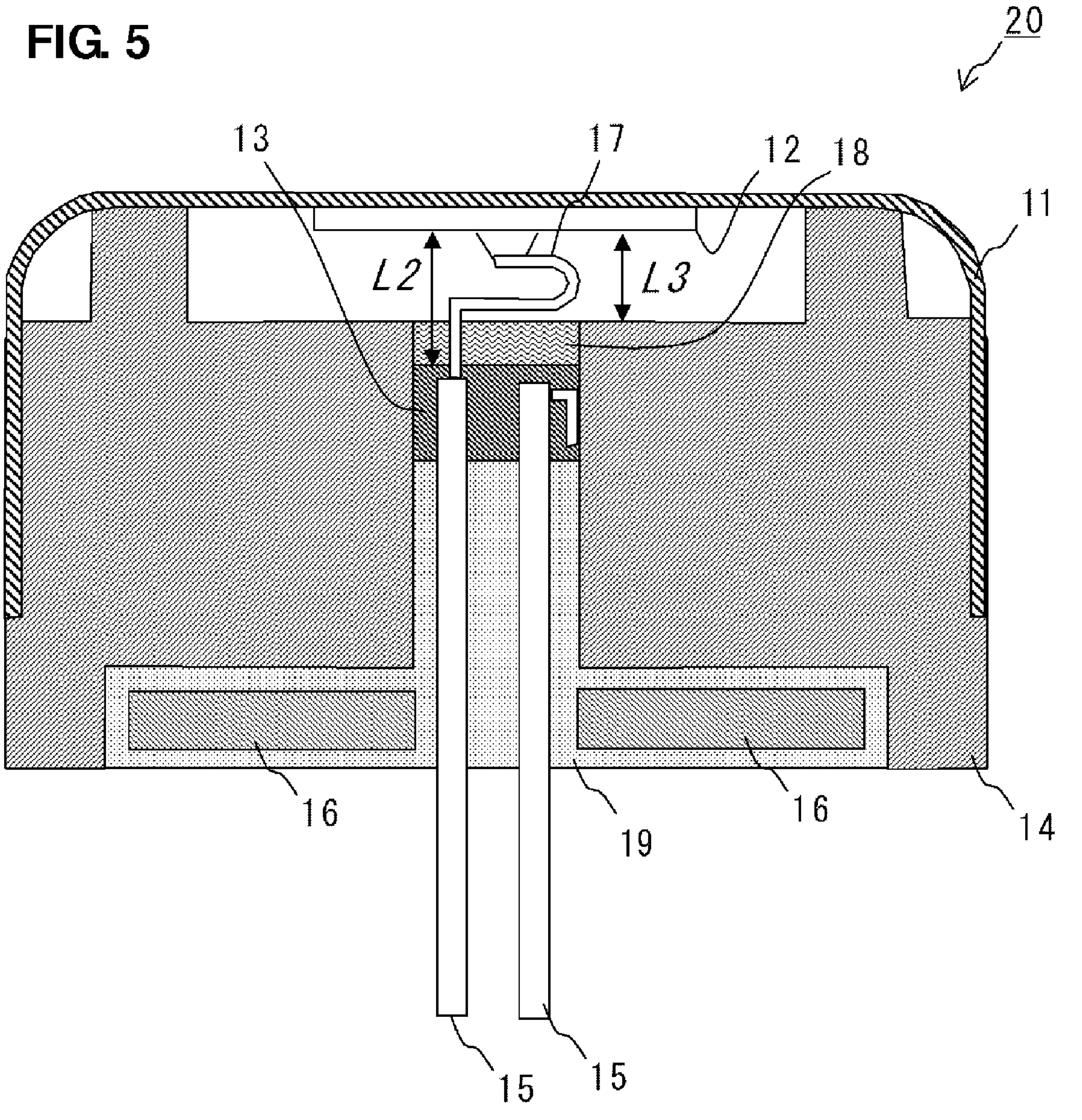
FIG. 5 is a schematic representation of an ultrasonic transducer according to a third preferred embodiment of the present invention.

FIG. 5 is a fragmentary sectional view of an ultrasonic transducer 20.

The ultrasonic transducer 20 includes an upper cover 11, a piezoelectric body 12, a fixed member 13, a weight 14, external connection terminals 15, a washer 16, a spring metal terminal 17, a sound-absorbing member 18, and a filler 19.

When the ultrasonic transducer 20 is used as a wave transmitter, a driving signal is applied to the external connection terminal 15 so that the piezoelectric body 12 extensionally vibrates in a horizontal plane. Consequently, a bending vibration occurs upward in the top surface of the upper cover 11 and, thus, ultrasonic waves are transmitted. When the ultrasonic transducer 20 is used as a wave receiver, the top surface of the upper cover 11 receives ultrasonic waves to vibrate, so that the piezoelectric body 12 extensionally vibrates to generate a wave-receiving signal in one of the external connection terminals 15.

The upper cover 11 has a substantially cylindrical shape including a closed upper end. The weight 14 has a cylindrical shape with a center axis extending in the vertical direction, and includes a recess at the lower end around the wall of the cylinder opening. The upper end of the weight 14 is engaged in the cylinder of the upper cover 11. The upper cover 11 and the weight 14 are thus combined to define a closed-ended substantially cylindrical case. The upper cover 11 corresponds to the top surface of the case.

Preferably, the piezoelectric body 12 has a polarization axis extending in the vertical direction, and is bonded to the inner surface of the top of the upper cover 11 with an adhesive. The piezoelectric body 12 includes a driving electrode (not shown) connected to one of the external connection terminals 15 through the spring metal terminal 17. The fixed member 13 is accommodated within the cylinder of the weight 14 and fixes the spring metal terminal 17 and the external connection terminals 15. The upper ends of the external connection terminals 15 are inserted into the fixed member 13, and the lower ends of the external connection terminals 15 extend from the fixed member 13. The sound-absorbing member 18 is disposed over the fixed member 13. The washer 16 is defined by a flat plate including an opening through which the external connection terminals 15 pass, and is disposed in the recess at the lower side of the weight 14. The filler 19 fills the space in the cylinder of the weight 14 under the fixed member 13.

With this structure, the fixed member 13 and a portion of the weight 14 function as a reflective portion that opposes the piezoelectric body 12. Accordingly, by setting the distance L2 between the fixed member 13 and the piezoelectric body 12 and the distance L3 between the weight 14 and the piezoelectric body 12 appropriately, the effects of reverberation on the ultrasonic transducer 20 can be greatly reduced. For example, it is preferable that the distance L2 be set so as to be an odd number multiple of a ¼ wavelength of ultrasonic waves and that the distance L3 be set so as to be less than or equal to the ¼ wavelength of ultrasonic waves. In addition, by setting the distances L2 and L3 so as to be equal to or greater than the maximum displacement of the piezoelectric body 12, contact between the piezoelectric body 12 and the fixed member 13 and sound-absorbing member 18 is prevented.

By setting the distances L2 and L3 so as to be an odd number multiple of a ¼ wavelength of sound waves and/or to be less than or equal to the ¼ wavelength of sound waves, the effects of reverberation are greatly reduced. In addition, by providing a sound-absorbing member 18 between the upper cover 11 and the fixed member 13, the effects of reverberation can be further Reduced.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An ultrasonic transducer comprising:

a substantially cylindrical case including one closed end in a center axis direction defining a top;

a piezoelectric body disposed on an inner surface of the top; and a reflective portion arranged to be opposed to and spaced apart from the piezoelectric body; wherein a distance between the piezoelectric body and the reflective portion is greater than a maximum displacement of the piezoelectric body, and is substantially an odd number multiple of a ¼ wavelength of sound waves or less than or equal to the ¼ wavelength.

2. The ultrasonic transducer according to claim 1, further comprising a sound-absorbing member arranged between the piezoelectric body and the reflective portion.

3. The ultrasonic transducer according to claim 2, wherein the reflective portion includes an opening arranged to communicate with an interior of the case and an exterior of the case, the opening being closed by the sound-absorbing member.

* * * * *